(12) United States Patent
Cho et al.

(10) Patent No.: US 9,715,029 B2
(45) Date of Patent: Jul. 25, 2017

(54) ELECTRIC FIELD SENSOR FOR UNDERWATER

(71) Applicant: KOREA INSTITUTE OF GEOSCIENCE AND MINERAL RESOURCES, Daejeon (KR)

(72) Inventors: Sung-Ho Cho, Daejeon (KR); Hyun-Key Jung, Daejeon (KR); Hyosun Lee, Daejeon (KR); Hyoungrea Rim, Daejeon (KR)

(73) Assignee: KOREA INSTITUTE OF GEOSCIENCE AND MINERAL RESOURCES, Daejeon (KR)

( * ) Notice: Subject to any disclaimer, the term of this patent is extended or adjusted under 35 U.S.C. 154(b) by 55 days.

(21) Appl. No.: 15/017,014

(22) Filed: Feb. 5, 2016

(65) Prior Publication Data

US 2017/0097436 A1   Apr. 6, 2017

(30) Foreign Application Priority Data

Oct. 6, 2015   (KR) .......................... 10-2015-0140285

(51) Int. Cl.
 *G01R 1/04*   (2006.01)
 *G01V 3/08*   (2006.01)
(52) U.S. Cl.
 CPC ............... *G01V 3/088* (2013.01); *G01R 1/04* (2013.01)

(58) Field of Classification Search
CPC combination set(s) only.
See application file for complete search history.

(56) References Cited

U.S. PATENT DOCUMENTS 4,218,975 A  *  8/1980  Ream .................. F42B 22/04
                                                 102/417

FOREIGN PATENT DOCUMENTS

| KR | 10-1200831 | 11/2012 |
|---|---|---|
| KR | 10-1281630 B1 | 3/2013 |
| KR | 10-1521473 | 5/2015 |

\* cited by examiner

*Primary Examiner* — Minh Phan
(74) *Attorney, Agent, or Firm* — Dentons US LLP

(57) ABSTRACT

An electric field sensor for underwater, including a sensing unit that senses a change in an electric field and transfers a sensing signal of the electric field to a signal line, a waterproof sealing unit that keeps a signal transferring portion of the sensing unit in a waterproof state, and a water-passing protection unit that shields and protects an exposed portion of the sensing unit. The sensing unit includes a nonconductive hollow pipe connected to the signal line, a sheet of carbon fiber that is wound around the outer surface of the hollow pipe and that senses an electric field, and a terminal ring that is electrically conductively installed at an end portion of the sheet of carbon fiber to provide a connection portion of the signal line and that is watertightly sealed by the waterproof sealing unit.

10 Claims, 8 Drawing Sheets

ELECTRIC FIELD SENSOR FOR UNDERWATER

CROSS-REFERENCE TO RELATED APPLICATION

This application claims priority to Korean Patent Application No. KR 2015-0140285 filed on Oct. 6, 2015 and all the benefits accruing therefrom under 35 U.S.C. §119, the contents of which are incorporated by reference in their entirety

BACKGROUND OF THE INVENTION

Field of the Invention

The present invention relates to an electric field sensor for underwater and, more particularly, to an electric field sensor for underwater that is installed on a seabed to detect a change in an electric field.

Description of the Related Art

A typical underwater object detection device is a SOund NAvigation and Ranging (SONAR).

As well known in the art, a SONAR senses noise (acoustic signal) emitted from a remote underwater sound source using a single or a plurality of underwater acoustic sensors and analyzes the acoustic signal, thereby determining characteristics and features of the aquatic or underwater sound source or locating the position of the aquatic or underwater sound source.

There are two types of underwater object detection methods: passive acoustic detection mode and active acoustic detection mode. More specifically, various technologies such as sonobuoy, SONAR, Towed Array Sonar System (TASS), Hull Mounted Sonar (HMS), and Hover Surveillance System (HSS) are used to detect a submarine. However, it was has been difficult to automatically detect a submarine over a wide range of water during long lengths of time.

An underwater object detection method using an acoustic signal is not an effective detection method in an area with heavy noise attributable to strong ocean current or an area with water layers being mixed due to a difference in salinity or temperature. Furthermore, it is difficult to detect an underwater object using an acoustic signal especially when a detection target is equipped with a sound-absorbing material.

There is an alternative method to detect an underwater moving object, whereby a moving object is detected by generating a magnetic field and detecting a change in the magnetic field attributable to the moving object. However, this technology has a disadvantage of having difficulty in detecting a moving object when there is another magnetic field that interferes with the magnetic field generated by the detection device.

Patent Document 1 discloses a technology to detect an underwater moving object using an electric field rather than an acoustic signal or a magnetic field.

The technology involves two direct current electrodes and a plurality of measurement electrodes to sense movement of a moving object having an electrical conductivity different from that of water. The technology detects a moving object by measuring a voltage between the measurement electrodes, the voltage being attributable to an electric field that is generated due to the voltage of the direct current electrodes.

As for the technology, sensitivity of a sensing member that senses an electric field is an important factor. The electrodes are conventionally made from graphite. Therefore, there are problems that it is difficult to manufacture a detection device employing the technology and the detection device made from graphite has low sensitivity.

DOCUMENTS OF RELATED ART

Patent Documents (Patent Document 1) Korean Patent No. 10-1281630
(Patent Document 2) Korean Patent No. 10-1200831
(Patent Document 3) Korean Patent No. 10-1521473

SUMMARY OF THE INVENTION

Accordingly, the present invention has been made keeping in mind the above problems occurring in the prior art, and an object of the present invention is to provide an electric field sensor for underwater that has a sensing portion made from carbon fiber to detect a change in an electric field rather than an acoustic signal or magnetic field, thereby improving sensitivity.

Specifically, another object of the present invention is to provide an electric field sensor for underwater that minimizes loss of an electric field that is extinguished through an end portion of a sheet of carbon fiber and in which the sheet of carbon fiber and a terminal are in tight contact with each other so that an electric current can flow.

In addition, a further object of the present invention is to provide an electric field sensor for underwater that keeps a connection terminal of a signal line in a waterproof state and shields a sheet of carbon fiber exposed to underwater environment.

In order to accomplish the objects of the invention, according to one aspect, there is provided an underwater electric field sensor including: a sensing unit that is installed on a seabed and has a portion exposed to underwater environment, the sensing unit sensing a change in an electric field and transferring a sensing signal of the electric field to a signal line; a waterproof sealing unit that keeps a signal transferring portion of the sensing unit in a waterproof state; and a water-passing protection unit that shields and protects an exposed portion of the sensing unit while allowing water to move in and out thereof; wherein the sensing unit includes: a nonconductive hollow pipe having a tubular body and an outer surface to which the signal line is connected; a sheet of carbon fiber that is wound around the outer surface of the hollow pipe, has a portion exposed to underwater environment, and senses an electric field; and a terminal ring that is electrically conductively installed at a first end portion of the sheet of carbon fiber to provide a connection portion of the signal line and that is watertightly sealed by the waterproof sealing unit.

The terminal ring is put only on a first end portion of the hollow pipe, and the sheet of carbon fiber is folded over on itself such that respective end portions thereof overlap each other, is tightly wound around the hollow pipe, and is fixed by the waterproof sealing unit.

The sheet of carbon fiber is provided with conductive coatings on the respective end portions thereof, is folded over on itself such that the conductive coatings on the respective end portions of the sheet of carbon fiber are in contact with each other, and is in tight contact with an outer surface of the terminal ring.

The sensing unit includes an additional terminal ring that is wound around an outer surface of the overlapped end portions of the sheet of carbon fiber and is made of a conductive material to connect the overlapped end portions of the sheet of carbon fiber to the signal line by cooperating with the terminal ring.

The waterproof sealing unit includes: a fixing cap that is put on the first end portion of the hollow pipe and fixes the sheet of carbon fiber to the hollow pipe by cooperating with the terminal ring; a waterproof tube that is put on the first end portion of the hollow pipe to cover an outer surface of the fixing cap and causes a portion of the terminal ring to be maintained in a waterproof state; and an epoxy waterproof member that is installed at a second end portion of the waterproof tube which is on an exposed side of the sheet of carbon fiber and is covered by the waterproof tube to prevent water from permeating into the terminal ring through the exposed portion of the sheet of carbon fiber.

The epoxy waterproof member includes: a pair of O-rings that are put on the outer surface of the sheet of carbon sheet and distanced from each other; a waterproof pipe that provides a waterproof space defined by an inner surface thereof and the O-rings inserted in the waterproof pipe and has a hole that communicates with the waterproof space; and a waterproof resin that is injected through the hole of the waterproof pipe to fill the waterproof space and is cured to waterproof the second end portion of the waterproof tube.

The fixing cap includes: collet pipes that are put on respective ends of the hollow pipe, accommodate a portion of the sheet of carbon fiber therein, are equipped with respective threaded portions and with notches that extend in a longitudinal direction thereof, and have respective internal diameters that are reduced when the collet pipes are pressed; and pressing rings that reduce the internal diameters of the collet pipes when the pressing rings are rotated forward, thereby pressing and fixing the sheet of carbon fiber to the hollow pipe.

The water-passing protection unit includes a mesh pipe that has a tubular body, is put on the outer surface of the hollow pipe to accommodate the sheet of carbon fiber and the hollow pipe therein, and is equipped with a plurality of communication holes to allow water to come into contact with the sheet of carbon fiber.

The water-passing protection unit includes: a sheet of non-woven fabric that is wound around the mesh pipe to shield the mesh pipe while allowing water to pass through the communication holes of the mesh pipe; and a non-woven fabric fastener that fixes the sheet of non-woven fabric to the mesh pipe.

The non-woven fabric fastener includes winding ring slots that protrude, similar to a flange, from outer surfaces of respective ends of the mesh pipe and that are equipped with respective notches through which respective ends of the sheet of non-woven fabric are inserted.

The electric field sensor for underwater according to one aspect of the invention senses a change in an electric field using a sheet of carbon fiber wound around a hollow pipe. Therefore, it has improved sensitivity. The sheet of carbon fiber is folded over on itself such that respective ends thereof are in contact with each other. In addition, the sheet of carbon fiber is wound around and in tight contact with a terminal ring, loss of a sensed electric field is minimized when a sensing signal of the electric field is transferred to a signal line.

In addition, since the respective ends of the sheet of carbon fiber are coated with conductive coatings and are in contact with each other when the sheet of carbon fiber is in tight contact with the terminal ring, an electric field that is sensed by the carbon fiber can be smoothly transmitted to the signal line. When an additional terminal ring is put on the outer surface of the sheet of carbon fiber, transmission of the sensing signal is more smoothly performed.

In addition, since a waterproof resin is injected into a waterproof space defined by an inner surface of a waterproof pipe and O-rings that serve as an epoxy waterproof member and are installed in the waterproof pipe and then cured in the waterproof space, the terminal ring can be kept in a perfect waterproof state.

When a mesh pipe or a sheet of non-woven fabric that constitute a water-passing protection unit is additionally used, it is possible to prevent the sheet of carbon fiber from being damaged by external impact or underwater foreign matter, so that the electric field sensor for underwater has improved durability.

DETAILED DESCRIPTION OF THE PRESENTLY PREFERRED EMBODIMENTS

Exemplary embodiments of the present invention will be described more fully hereinafter with reference to the accompanying drawings. In the following description of the present invention, detailed descriptions of known functions and components incorporated herein will be omitted when it may make the subject matter of the present invention unclear.

Reference will now be made in detail to various embodiments of the present invention, specific examples of which are illustrated in the accompanying drawings and described below, since the embodiments of the present invention can be variously modified in many different forms. While the present invention will be described in conjunction with exemplary embodiments thereof, it is to be understood that the present description is not intended to limit the present invention to those exemplary embodiments. On the contrary, the present invention is intended to cover not only the exemplary embodiments, but also various alternatives, modifications, equivalents and other embodiments that may be included within the spirit and scope of the present invention as defined by the appended claims.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between," "directly between," "adjacent to," or "directly adjacent to," should be construed in the same way.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Figure 1:
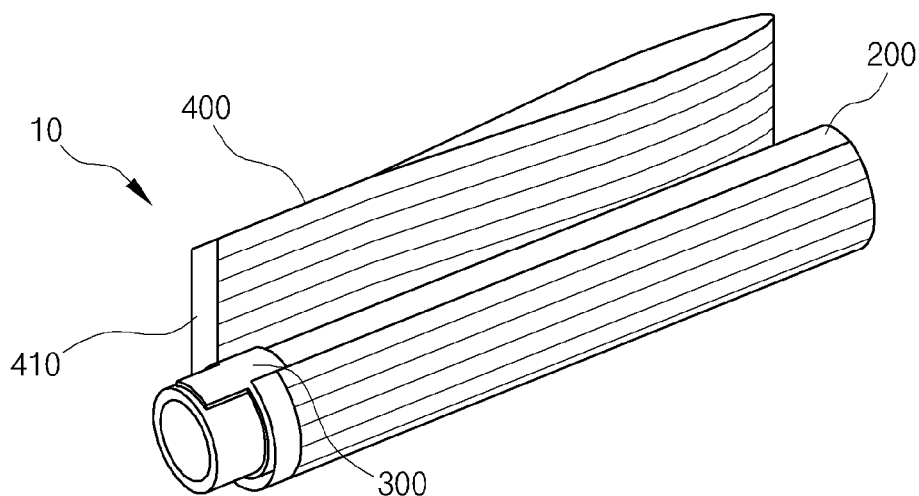
FIG. 1 is a perspective view illustrating a sensing unit of an electric field sensor for underwater according to one embodiment of the present invention.
Figure 2:
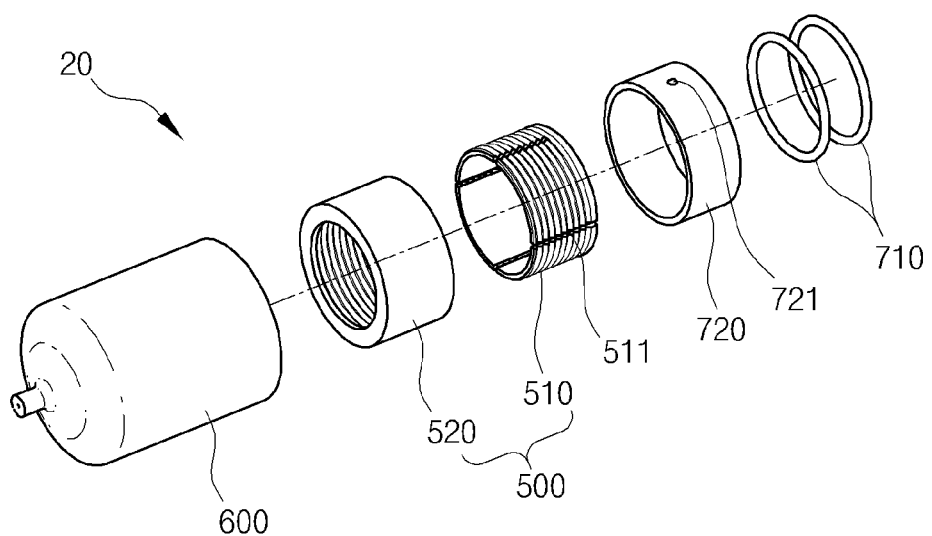
FIG. 2 is an exploded perspective view illustrating a waterproof sealing unit of the electric field sensor for underwater according to the embodiment of the present invention.
Figure 3:
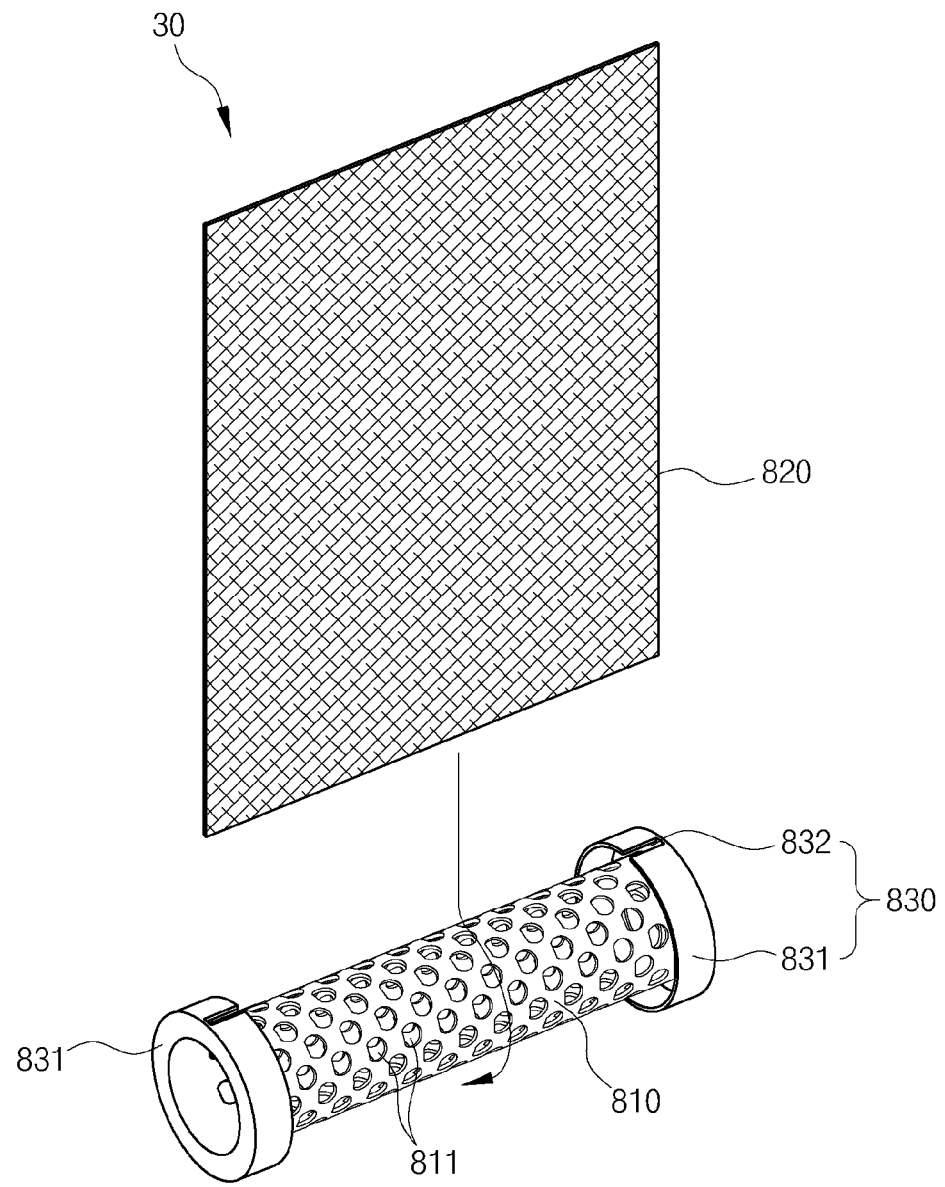
FIG. 3 is an exploded perspective view illustrating a water-passing protection unit of the electric field sensor for underwater according to the embodiment of the present invention.

An electric field sensor for underwater 1 according to one embodiment of the present invention includes a sensing unit 10 shown in FIG. 1, a waterproof sealing unit 20 shown in FIG. 2, and a water-passing protection unit 30 shown in FIG. 3.

The sensing unit 10 is installed on a seabed. When the sensing unit 10 is installed, a portion of the sensing unit 10 is exposed to water, senses a change in an electric field, and provides a sensing signal of the electric field.

Figure 4:
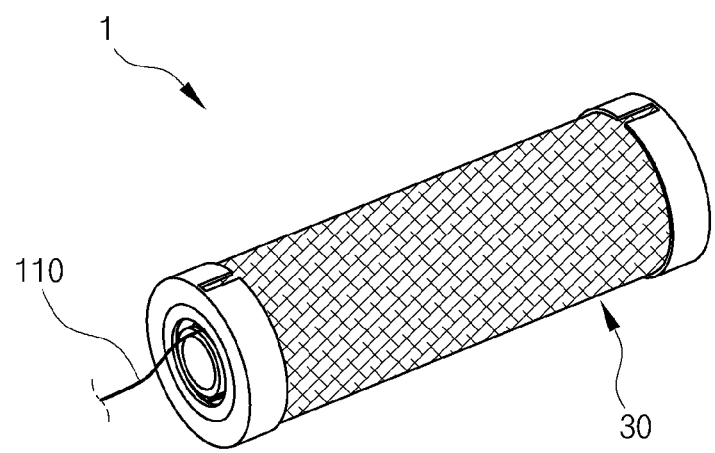
FIG. 4 is a perspective view illustrating the electric field sensor for underwater according to the embodiment of the present invention.

As illustrated in FIG. 1, the sensing unit 10 includes a hollow pipe 200, a terminal ring 300, and a sheet of carbon fiber 400. The sensing unit 10 sends a sensing signal to an operator via a signal line 110 as illustrated in FIGS. 4 and 5.

As illustrated in FIG. 1, the hollow pipe 200 is made from a nonconductive material and serves as an outer shell of the electric field sensor for underwater.

The terminal ring 300 is a member serving as a grounding part for the signal line 110. As illustrated in FIG. 1, the terminal ring 300 is a conductive ring made of a metallic material. The terminal ring 300 is put on the outer surface of a first end of the hollow pipe 200 and connected to the signal line 110.

The terminal ring 300 is put on the first end portion of the hollow pipe 200 as illustrated in FIG. 1. A sheet of carbon fiber 400 is folded over on itself so that respective end portions thereof overlap each other and the overlapped end portions of the sheet of carbon fiber 400 are connected to the terminal ring 300.

The carbon fiber 400 senses an electric field under water and transfers a signal of the sensed electric field to the signal line 110 via the terminal ring 300.

Carbon fiber is excellent in heat resistance, impact resistance, and chemical resistance, and is lighter than metal. Furthermore, it has good elasticity, strength, and conductivity.

As illustrated in FIG. 1, the sheet of carbon fiber 400 is folded over on itself so that ends of the sheet overlap each other. The sheet of carbon fiber 400 that is folded over on itself is wound around the hollow pipe 200 and fixed by a fixing cap 500 to be described later in a state in which the overlapped end portions of the sheet of carbon fiber 400 are in tight contact with the outer surface of the terminal ring 300.

Figure 6A:
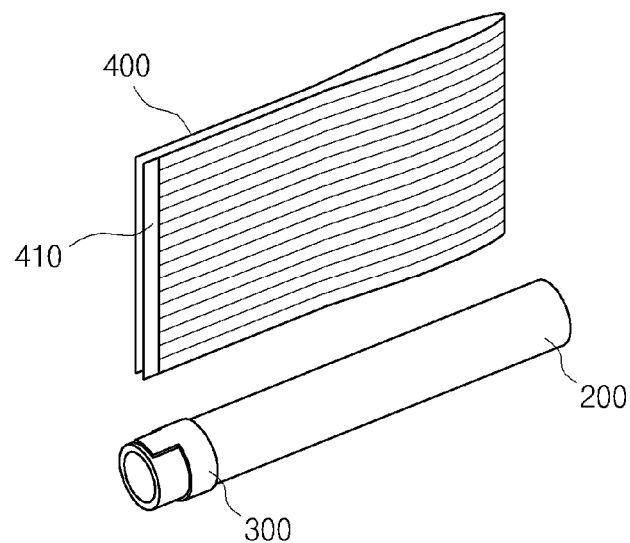
FIGS. 6A to 6C are diagrams illustrating an assembling process of the sensing unit.
Figure 6B:
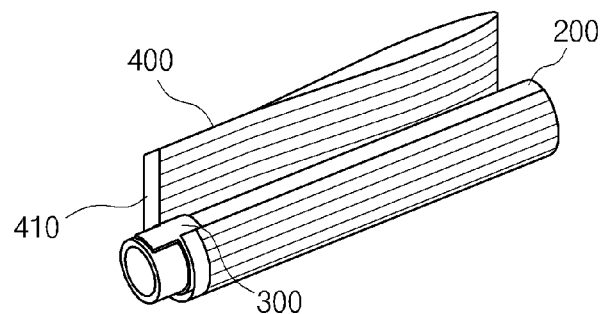

Since the sheet of carbon fiber 400 that is folded over on itself is wound around the hollow pipe 200 as illustrated in FIG. 6B, the overlapped end portions of the folded carbon fiber sheet 400 are arranged at a first end portion of the hollow pipe 200 so as to be in contact with the terminal ring 300.

Therefore, an electric field is not lost while it is moving toward the overlapped end portions of the sheet of carbon fiber 400. That is, the sensing signal of the electric field can be transmitted to the terminal ring 300 without any loss.

The overlapped end portions of the sheet of carbon fiber 400 are coated with respective conductive coatings 410 as illustrated in FIG. 1.

As for the sheet of carbon fiber 400, the conductive coatings 410 on the overlapped end portions of the sheet of carbon fiber 400 overlap each other and, in this state, are wound around an outer surface of the terminal ring 300 and are in tight contact with the outer surface of the terminal ring 300. Therefore, the signal of the sensed electric field can be more smoothly transmitted to the signal line 110 via the terminal ring 300.

Figure 5B:
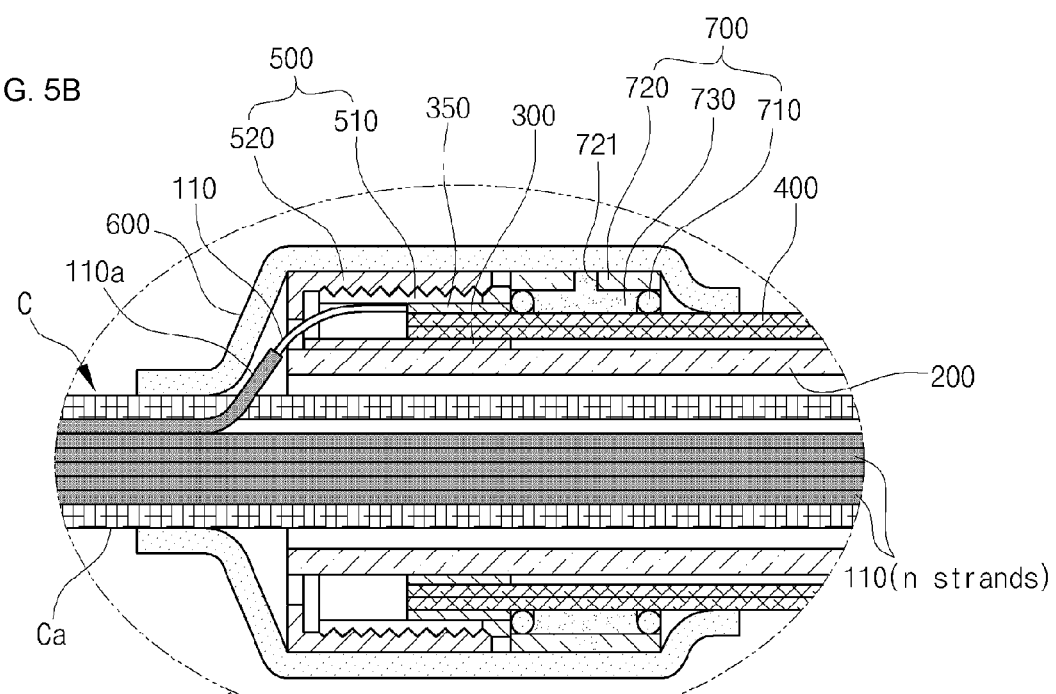
FIG. 5B is an enlarged cross-sectional view of reference number 601 as shown in FIG. 5A.
Figure 5A:
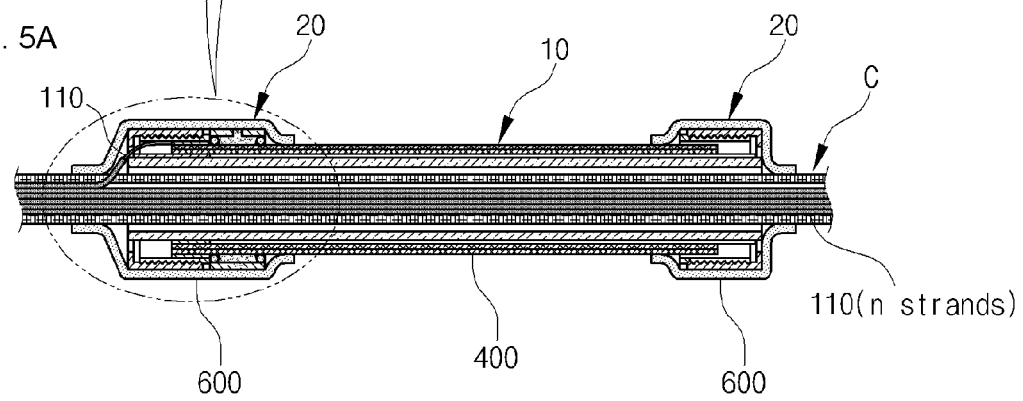
FIG. 5A is a cross-sectional view illustrating a state in which the sensing unit and the waterproof sealing unit are installed.
Figure 6C:
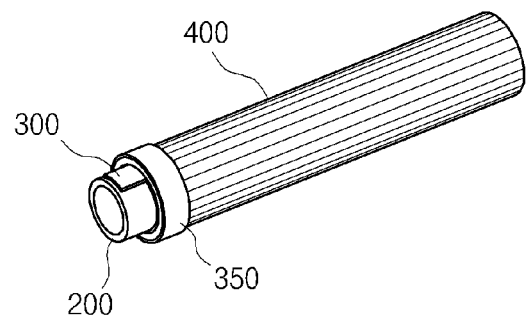

The sensing unit 10 may further include an additional terminal ring 350 as illustrated in FIGS. 5 and 6C.

The additional terminal ring 350 is made of a conductive material such as a metal and is fixed to the outer surface of the conductive coating 410 provided on the end portion of the sheet of carbon fiber 400.

The sheet of carbon fiber 400 is in tight contact with the outer surface of the terminal ring 300 via the conductive coating 410 and with an inner surface of the additional terminal ring 350 so that the electric field can be transmitted to the signal line 110 without any loss.

The waterproof sealing unit 20 is a waterproof member that keeps, in a waterproof state, the terminal ring 300 serving as a signal transmission portion of the sensing unit 10.

The waterproof sealing unit 20 may include a fixing cap 500, a waterproof tube 600, and an epoxy waterproof member 700 as illustrated in FIG. 2.

The fixing cap 500 fixes the sheet of carbon fiber 400 to the hollow pipe 200 by cooperating with the terminal ring 400.

The fixing cap 500 may include a collet pipe 510 and a pressing ring 520, as illustrated in FIG. 2.

The collet pipe 510 is a pipe with a plurality of notches 511 that extends in a longitudinal direction thereof. The internal diameter of the collet pipe 510 is reduced when the collet pipe is pressed.

There are two collet pipes 510 that are put on respective ends (first and second ends) of the hollow pipe 200. Each collet pipe 510 accommodates a portion of the sheet of carbon fiber 400 and is equipped with a threaded portion on the outer surface thereof.

One collet pipe 510 accommodates the terminal ring 300 and a portion of the sheet of carbon fiber 400.

The pressing ring 520 is combined with the collet pipe 510 in a screwed manner. When the pressing ring 520 is rotated, the internal diameter of the collet pipe 510 is reduced so that the sheet of carbon fiber 400 is pressed against the hollow pipe 200 and the sheet of carbon fiber 400 is firmly fixed to the hollow pipe 200.

Waterproof tubes 600 cover the outer surfaces of the respective fixing caps 500 to seal the inside of the hollow pipe 200.

The waterproof tubes 600 are made of rubber having high elasticity and flexibility and seal respective ends (first and second ends) of the hollow pipe 200 so that the inside of the hollow pipe 200 can be kept in a waterproof state.

The epoxy waterproof member 700 keeps a portion of the outer surface of the sheet of carbon fiber 400 in a waterproof state while it is disposed at a second end portion of the waterproof tube 600. The second end portion of the waterproof tube 600 is an end portion near an exposed portion of the sheet of carbon fiber 400. It prevents water from permeating into the terminal ring 300 through the exposed portion of the sheet of carbon fiber 400.

As illustrated in FIGS. 2 and 5A-B, the epoxy waterproof member 700 may include a pair of O-rings 710, a waterproof pipe 720, and a waterproof resin 730.

The O-rings 710 are distanced from each other and put on the outer surface of the sheet of carbon fiber 400.

The waterproof pipe 720 is a tubular body and the O-rings 710 are inserted into the waterproof pipe 720 to be placed in the inside of the waterproof pipe 720. When the O-rings 710 are in contact with the inner surface of the waterproof pipe 720, a waterproof space defined by the inner surface of the waterproof pipe 720 and the O-rings 710 disposed in the waterproof pipe 720 and distanced from each other is formed in the waterproof pipe 720. The waterproof space is filled with a waterproof resin 730. The waterproof pipe 720 is equipped with a hole 721 which communicates with the waterproof space. The hole 721 allows uncured waterproof resin 730 to be injected into the waterproof space.

The waterproof resin 730 fills the waterproof space formed in the waterproof pipe 720 and is then cured there to waterproof the second end portion of the waterproof tube 600.

The waterproof resin 730 may be made from epoxy resin or urethane resin. The waterproof resin 730 is first injected into the waterproof space through the hole 721 of the waterproof pipe 720 and then cured to prevent water from permeating into the terminal ring 300.

The epoxy waterproof member 700 is also provided on the outer surface of the sheet of carbon fiber 400 at a second end of the hollow pipe 200 that is not equipped with the terminal ring 300. The epoxy waterproof member 700 and the waterproof tube 600 provide waterproof function.

As illustrated in FIG. 4, the water-passing protection unit 30 shields the outer surface of the sheet of carbon fiber 400 exposed to water while allowing water to pass therethrough. The water-passing protection unit 30 is an element to protect the sheet of carbon fiber 400 from external impact or underwater foreign matter.

The water-passing protection unit 30 may include a mesh pipe 810, as illustrated in FIG. 3.

The mesh pipe 810 has a tubular body with a plurality of communication holes 811. The hollow pipe 200 is inserted into the mesh pipe 810 so that the mesh pipe 810 is put on the outer surface of the hollow pipe 200, thereby shielding the sheet of carbon fiber 400.

The sheet of carbon fiber 400 is shielded by the mesh pipe 810 and senses an electric field when water moves in and out through the communication holes 811.

As illustrated in FIG. 3, the water-passing protection unit 30 may include a sheet of non-woven fabric 820 and a non-woven fabric fastener 830.

The sheet of non-woven fabric 820 is wound around the outer surface of the mesh pipe 810, thereby shielding the mesh pipe 810 while allowing water to move in and out. In this way, the sheet of non-woven fabric 820 protects the sheet of carbon fiber 400.

The non-woven fabric fastener 830 is an element that fixes respective ends of the sheet of non-woven fabric 820 to the mesh pipe 810. As illustrated in FIG. 3, the non-woven fabric fastener 830 may be a winding ring slot 831 that is arranged at an end of the mesh pipe 810 to protrude, similar to a flange, from the outer surface of the mesh pipe 810.

As for the winding ring slot 831, an end of the sheet of non-woven fabric 820 is inserted into the winding ring slot 831 and is then wound around the outer surface of the mesh pipe 810. As illustrated in the drawings, the winding ring slots 831 protrude, similar to flanges, from the outer surfaces of respective end portions of the mesh pipe 810. They have respective insertion slots that extend in the circumferential direction so that the ends of the sheet of non-woven fabric 820 are inserted into the insertion slots. Each winding ring slot 831 has a notch 832 through which the end of the sheet of non-woven fabric 820 is inserted into the insertion slot of the winding ring slot 831.

The ends of the sheet of non-woven fabric 820 are inserted into the winding ring slots 831 through the notches 832 and then the sheet of non-woven fabric 820 is wound around and fixed to the mesh pipe 820, so that the sheet of carbon fiber 400 is protected.

An assembling process of the electric field sensor for underwater according to the present invention will be described with reference to FIGS. 6A to 6C and 7A to 7D.

As illustrated in FIG. 6A, the terminal ring 300 is put on the first end portion of the hollow pipe 200, the signal line 110 is connected to the terminal ring 300, and the sheet of carbon fiber 400 that is equipped with the conductive coatings 410 at respective ends thereof is folded over on itself such that the conductive coatings 410 overlap each other.

Next, as illustrated in FIG. 6B, the sheet of carbon fiber 400 is wound around the hollow pipe 200 and the overlapped conductive coatings 410 come into tight contact with the outer surface of the terminal ring 300. Next, as illustrated in FIG. 6C, the additional terminal ring 350 is put on the outer surface of the overlapped conductive coatings 410.

Figure 7A:
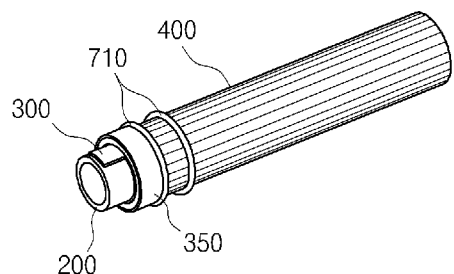
FIGS. 7A to 7D are diagrams illustrating an installing process of the waterproof sealing unit.
Figure 7B:
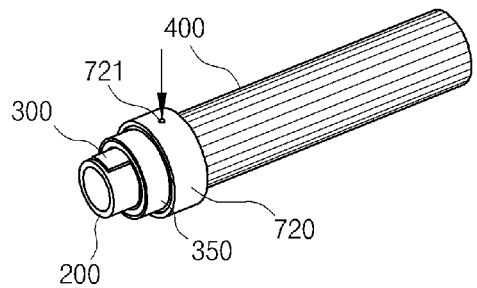

Next, as illustrated in FIG. 7A, the O-rings 710 are put next to the additional terminal ring 350 in a manner of being distanced from each other. Next, as illustrated in FIG. 7B, the waterproof pipe 720 is put on the O-rings 710 and waterproof resin is injected into the waterproof space in the waterproof pipe 720 through the hole 721 and is then cured.

Figure 7C:
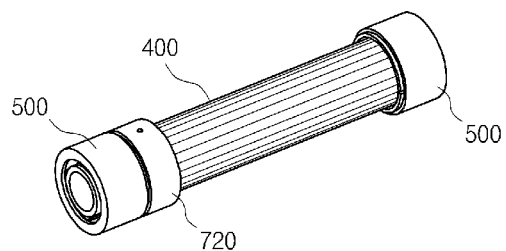
Figure 7D:
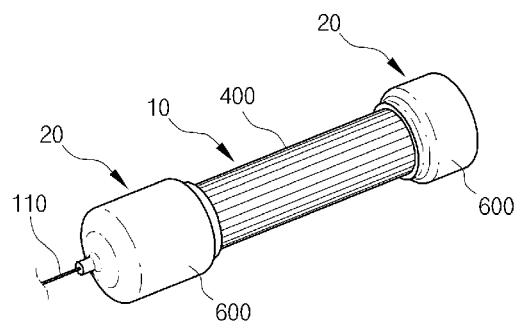

Next, as illustrated in FIG. 7C, the fixing caps 500 are put on the outer surfaces of the first and second end portions of the hollow pipe 200 to fix the sheet of carbon fiber 400 to the hollow pipe 200. Next, as illustrated in FIG. 7D, the waterproof tubes 600 are put on the outer surfaces of the fixing caps 500, thereby keeping the respective ends (first and second ends) of the hollow pipe 200 in a waterproof state.

The electric field sensor for underwater 1 may not include the water-passing protection unit 30 but may include only the sensing unit 10 and the waterproof sealing unit 20 as necessary.

When the water-passing protection unit 30 is assembled, the sheet of carbon fiber 400 and the waterproof tube 600 are first inserted into the mesh pipe 810 so that the mesh pipe 810 is put on the outer surface of the sheet of carbon fiber 400. Next, the sheet of non-woven fabric 820 is wound around the mesh pipe 810 and end portions of the sheet of non-woven fabric 820 are inserted into the winding ring slots 831 of the mesh pipe 810.

The electric field sensor for underwater 1 that is assembled through the assembling process described above is installed on a seabed and transmits a sensing signal via a single signal line 110.

Figure 8:
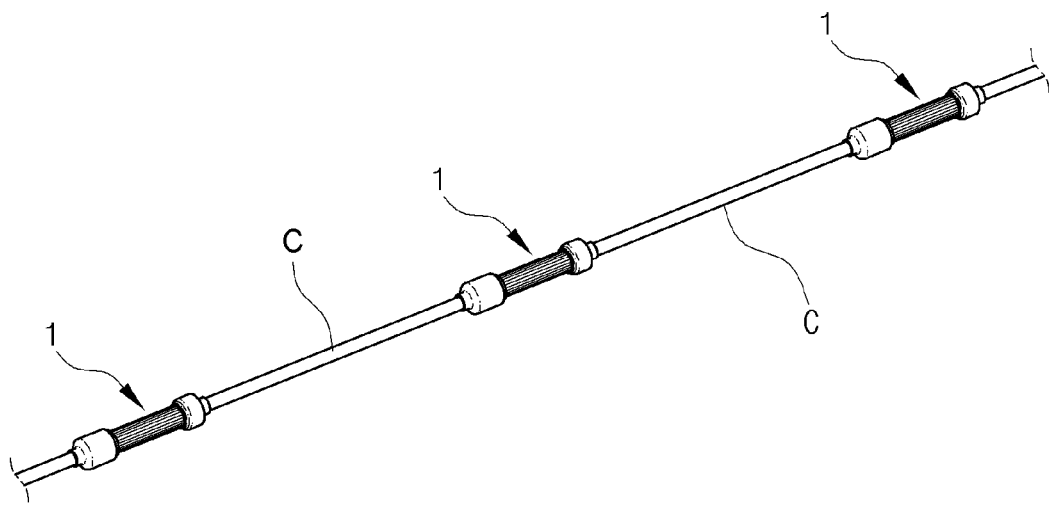
FIG. 8 is perspective view illustrating a state in which the electric field sensor for underwater according to the embodiment of the present invention is installed on a seabed.

Alternatively, as illustrated in FIG. 8, a plurality of electric field sensors for underwater 1 may be installed on a seabed at regular intervals to sense an electric field (the illustration of FIG. 8 does not show the water-passing protection unit 30).

The signal lines 110 and the electric field sensors for underwater 1 are in a one-to-one correspondence relationship. The signal lines 110 are bundled to form a multi-cable C. The multi-cable C is inserted into the hollow pipe 200 but the signal lines 110 are connected to the respective terminal rings 300 of the electric field sensor for underwater 1 one by one.

As illustrated in FIGS. 5A and 5B, n strands of signal lines 110 are bundled in a multi-cable C and each signal line is covered by sheath 110c. The signal lines 110 correspond to the electric field sensors for underwater 1. The multi-cable C is covered by cable sheath Ca and extends through the hollow pipe 200. Each cable of the signal line is connected to the corresponding terminal ring 300.

As having been described above, as for the electric field sensor for underwater, since the sheet of carbon fiber 400 is folded over on itself such that the respective ends of the sheet of carbon fiber 400 overlap each other and the folded carbon fiber sheet is tightly wound around the terminal ring 300, loss of an electric field that is sensed is minimized and a sensing signal of the electric field is smoothly transmitted to the signal line. The respective ends of the sheet of carbon fiber 400 are coated with conductive coatings 410 and are in contact with each other. In this state, since the sheet of carbon fiber 400 is in tight contact with the terminal ring 300, the electric field sensed by the carbon fiber can be smoothly transmitted to the signal line.

Although the preferred embodiments of the present invention have been disclosed for only illustrative purposes, the preferred embodiments of the present invention are not intended to limit the scope of the invention. Those skilled in the art will appreciate that various modifications, additions and substitutions are possible, without departing from the scope and spirit of the invention as disclosed in the accompanying claims.

What is claimed is:

1. An electric field sensor for underwater, comprising:
a sensing unit that is installed on a seabed and has a portion exposed to underwater environment, the sensing unit sensing a change in an electric field and transferring a sensing signal of the electric field to a signal line;
a waterproof sealing unit that keeps a signal transferring portion of the sensing unit in a waterproof state; and
a water-passing protection unit that shields and protects an exposed portion of the sensing unit while allowing water to move in and out thereof;
wherein the sensing unit includes:
a nonconductive hollow pipe having a tubular body and an outer surface to which the signal line is connected,
a sheet of carbon fiber that is wound around the outer surface of the hollow pipe, has a portion exposed to underwater environment, and senses an electric field, and
a terminal ring that is electrically conductively installed at a first end portion of the sheet of carbon fiber to provide a connection portion of the signal line and that is watertightly sealed by the waterproof sealing unit.

2. The electric field sensor for underwater according to claim 1, wherein the terminal ring is put only on a first end portion of the hollow pipe, and the sheet of carbon fiber is folded over on itself such that respective end portions thereof overlap each other, is tightly wound around the hollow pipe, and is fixed by the waterproof sealing unit.

3. The electric field sensor for underwater according to claim 2, wherein the sheet of carbon fiber is provided with conductive coatings on the respective end portions thereof, is folded over on itself such that the conductive coatings on the respective end portions of the sheet of carbon fiber are in contact with each other, and is in tight contact with an outer surface of the terminal ring.

4. The electric field sensor for underwater according to claim 2, wherein the sensing unit includes an additional terminal ring that is wound around an outer surface of the overlapped end portions of the sheet of carbon fiber and is made of a conductive material to connect the overlapped end portions of the sheet of carbon fiber to the signal line by cooperating with the terminal ring.

5. The electric field sensor for underwater according to claim 1, wherein the waterproof sealing unit includes:
a fixing cap that is put on the first end portion of the hollow pipe and fixes the sheet of carbon fiber to the hollow pipe by cooperating with the terminal ring;
a waterproof tube that is put on the first end portion of the hollow pipe to cover an outer surface of the fixing cap and causes a portion of the terminal ring to be maintained in a waterproof state; and
an epoxy waterproof member that is installed at a second end portion of the waterproof tube which is on an exposed side of the sheet of carbon fiber and is covered by the waterproof tube to prevent water from permeating into the terminal ring through the exposed portion of the sheet of carbon fiber.

6. The electric field sensor for underwater according to claim 5, wherein the epoxy waterproof member includes:
a pair of O-rings that are put on the outer surface of the sheet of carbon sheet and distanced from each other;
a waterproof pipe that provides a waterproof space defined by an inner surface thereof and the O-rings inserted in the waterproof pipe and has a hole that communicates with the waterproof space; and
a waterproof resin that is injected through the hole of the waterproof pipe to fill the waterproof space and is cured to waterproof the second end portion of the waterproof tube.

7. The electric field sensor for underwater according to claim 5, wherein the fixing cap includes:
collet pipes that are put on respective ends of the hollow pipe, accommodate a portion of the sheet of carbon fiber therein, are equipped with respective threaded portions and with notches that extend in a longitudinal direction thereof, and have respective internal diameters that are reduced when the collet pipes are pressed; and
pressing rings that reduce the internal diameters of the collet pipes when the pressing rings are rotated forward, thereby pressing and fixing the sheet of carbon fiber to the hollow pipe.

8. The electric field sensor for underwater according to claim 1, wherein the water-passing protection unit includes a mesh pipe that has a tubular body, is put on the outer surface of the hollow pipe to accommodate the sheet of carbon fiber and the hollow pipe therein, and is equipped with a plurality of communication holes to allow water to come into contact with the sheet of carbon fiber.

9. The electric field sensor for underwater according to claim 8, wherein the water-passing protection unit includes:
- a sheet of non-woven fabric that is wound around the mesh pipe to shield the mesh pipe while allowing water to pass through the communication holes of the mesh pipe; and
- a non-woven fabric fastener that fixes the sheet of non-woven fabric to the mesh pipe.

10. The electric field sensor for underwater according to claim 9, wherein the non-woven fabric fastener includes winding ring slots that protrude, similar to a flange, from outer surfaces of respective ends of the mesh pipe and that are equipped with respective notches through which respective ends of the sheet of non-woven fabric are inserted.

\* \* \* \* \*